(12) United States Patent
Baggenstoss

(10) Patent No.: US 6,569,574 B2
(45) Date of Patent: May 27, 2003

(54) METHODS OF PATTERNING RADIATION, METHODS OF FORMING RADIATION-PATTERNING TOOLS, AND RADIATION-PATTERNING TOOLS

(75) Inventor: Bill Baggenstoss, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/420,205

(22) Filed: Oct. 18, 1999

(65) Prior Publication Data

US 2002/0142228 A1 Oct. 3, 2002

(51) Int. Cl.$^7$ .............. G03F 9/00; G03C 5/00
(52) U.S. Cl. .............. 430/5; 430/30; 430/396
(58) Field of Search .............. 430/5, 322, 346, 430/323, 324, 30, 396

(56) References Cited

U.S. PATENT DOCUMENTS

| | | | | |
|---|---|---|---|---|
| 4,902,899 A | * | 2/1990 | Lin et al. ............... | 250/492 |
| 5,194,344 A | | 3/1993 | Cathey, Jr. et al. ...... | 430/5 |
| 5,194,345 A | | 3/1993 | Rolfson .................. | 430/5 |
| 5,194,346 A | | 3/1993 | Rolfson et al. .......... | 430/5 |
| 5,225,035 A | | 7/1993 | Rolfson .................. | 216/47 |
| 5,240,796 A | | 8/1993 | Lee et al. ............... | 430/5 |
| 5,281,500 A | | 1/1994 | Cathey et al. ........... | 430/5 |
| 5,376,483 A | | 12/1994 | Rolfson .................. | 430/5 |
| 5,468,578 A | | 11/1995 | Rolfson .................. | 430/5 |
| 5,495,959 A | | 3/1996 | Rolfson .................. | 216/12 |
| 5,536,606 A | | 7/1996 | Doan ...................... | 430/5 |
| 5,563,009 A | * | 10/1996 | Bae ....................... | 430/5 |
| 5,576,126 A | | 11/1996 | Rolfson .................. | 430/5 |
| 5,635,315 A | | 6/1997 | Mitsui .................... | 430/5 |
| 5,667,918 A | | 9/1997 | Brainerd et al. ......... | 430/5 |
| 5,667,919 A | | 9/1997 | Tu et al. ................. | 430/5 |
| 5,672,450 A | | 9/1997 | Rolfson .................. | 430/5 |
| 5,700,602 A | | 12/1997 | Dao et al. ............... | 430/5 |
| 5,725,973 A | * | 3/1998 | Han et al. ............... | 430/5 |

(List continued on next page.)

OTHER PUBLICATIONS

U.S. patent application Ser. No. 09/389,870, Doan, filed Sep. 2, 1999.

U.S. patent application Ser. No. 09/365,980, Rolfson et al., filed Aug. 2, 1999.

Chen, Fung J. et al., "Optical proximity correction for intermediate–pitch features using sub–resolution scattering bars" Received May 28, 1998; accepted Jul. 9, 1997, *J.Vac. Sci. Technol. B* 15(6) Nov./Dec. 1997.

Primary Examiner—Mark F. Huff
Assistant Examiner—Saleha R. Mohamedulla
(74) Attorney, Agent, or Firm—Wells St. John P.S.

(57) ABSTRACT

The invention includes a method of patterning radiation. The radiation is simultaneously passed through a structure and at least one subresolution assist feature proximate the structure. The structure defines a pattern of radiation intensity. The at least one subresolution assist feature comprises a material that is transmissive of at least a portion of the radiation. The subresolution assist feature alters the pattern of radiation intensity defined by the structure relative to a pattern of radiation intensity that would be defined in the absence of the subresolution assist feature. The invention also includes another method of patterning radiation. The radiation is simultaneously passed through a first material structure and at least one second material subresolution assist feature proximate the first material structure. The second material is different than the first material. The subresolution assist feature alters a pattern of radiation intensity defined by the first material structure relative to a pattern that would be defined in the absence of the subresolution assist feature. The invention further includes methods of forming radiation-patterning tools, and the radiation-patterning tools themselves.

20 Claims, 3 Drawing Sheets

U.S. PATENT DOCUMENTS

| | | |
|---|---|---|
| 5,766,805 A | 6/1998 | Lee et al. .................... 430/5 |
| 5,766,829 A | 6/1998 | Cathey, Jr. et al. ......... 430/394 |
| 5,827,625 A * | 10/1998 | Lucas et al. .................. 430/5 |
| 5,882,827 A | 3/1999 | Nakao .......................... 430/5 |
| 5,888,674 A | 3/1999 | Yang et al. .................... 430/5 |
| 5,939,225 A * | 8/1999 | Dove et al. .................... 430/5 |
| 6,183,915 B1 * | 2/2001 | Rolfson ......................... 430/5 |
| 6,274,281 B1 * | 8/2001 | Chen ............................. 430/5 |

* cited by examiner

METHODS OF PATTERNING RADIATION, METHODS OF FORMING RADIATION-PATTERNING TOOLS, AND RADIATION-PATTERNING TOOLS

TECHNICAL FIELD

The invention pertains to methods of patterning radiation, methods of forming radiation-patterning tools, and to radiation-patterning tools themselves.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a semiconductor wafer. The radiation-patterning tool can be, for example, a photomask or a reticle, with the term "photomask" being sometimes understood to refer to masks which define a pattern for an entirety of a wafer, and the term "reticle" being sometimes understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting the claims that follow, the terms "photomask" and "reticle" will be given their historical distinction such that the term "photomask" will refer to a patterning tool that defines a pattern for an entirety of a wafer, and the term "reticle" will refer to a patterning tool that defines a pattern for only a portion of a wafer.

Radiation-patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements on radiation-patterning tools, and ever-increasing requirements for precision and accuracy in radiation-patterning with the tools.

An exemplary prior art radiation-patterning tool 12 is shown in FIG. 1. Radiation-patterning tool 12 comprises a substrate 14 which is at least partially transparent to radiation which is to be patterned, and a structure 16 joined to substrate 14 and formed of a material which is less transparent to the radiation than is substrate 14. Substrate 14 typically comprises fused silica (for example, quartz), and structure 16 typically comprises chrome.

FIG. 1 further illustrates radiation 18 being directed toward radiation-patterning tool 12, and shows a plot 20 of radiation intensity exiting from radiation-patterning tool 12. Plot 20 illustrates that structure 16 has attenuated the radiation intensity. Specifically, plot 20 comprises a region 22 of decreased intensity where radiation 18 has been at least partially blocked by structure 16, and higher intensity regions 24 where radiation 18 has not been blocked by structure 16. In particular embodiments of the prior art, structure 16 will comprise a material substantially opaque to radiation 18 (for example, chrome can be opaque relative to ultraviolet light), and substrate 14 will be substantially transparent to the radiation (for example, quartz can be transparent to ultraviolet light).

A problem associated with the radiation-patterning described with reference to FIG. 1 can be in accurately and reproducibly forming the dip in radiation intensity shown at region 22 of plot 20. Specifically, if radiation 18 is slightly defocused from an optimal focus position, the depth of region 22 (i.e., the change in intensity between region 22 and regions 24) can be altered, which can cause variation in a critical dimension of openings ultimately patterned into photoresist. Also, the shape of the intensity profile in graph 20 can be less precise than is desired. Specifically, it would be ideal if the intensity profile of plot 20 exactly mirrored the pattern defined by structure 16 (i.e., if the intensity profile had sharp corners at transitions between regions 24 and 22, and if region 22 had a flat bottom with a width corresponding to that of structure 16).

An improved prior art radiation-patterning tool 12a is described with reference to FIG. 2. In referring to FIG. 2, similar numbering is utilized as was used in referring to FIG. 1, with the suffix "a" used to indicate structures shown in FIG. 2. Radiation-patterning tool 12a is similar to the patterning tool 12 of FIG. 1 in that it comprises a substrate 14a which is at least partially transparent to incoming radiation 18a, and a structure 16a which is less transparent to radiation 18a than the substrate. However, radiation-patterning tool 12a differs from the patterning tool 12 of FIG. 1 in that subresolution assist features 30 are provided adjacent structure 16a. Subresolution assist features 30 are formed of an identical material as structure 16a (which simplifies processing, as a single material can be formed over substrate 14a and patterned to form features 30 and structures 16a). Features 30 are referred to as subresolution assist features because intensity variations caused by features 30 are not resolved from intensity variations caused by structures 16a at the resolution provided by the particular wavelength of incoming radiation 18a. This is shown in the intensity graph 20a. Specifically, graph 20a shows a dip 22a corresponding to a region wherein an intensity variation is caused by structure 16a, and shoulders 32 corresponding to regions wherein intensity variation is caused primarily by features 30. Since the intensity variations caused by features 30 are shoulders 32 along region 22a, rather than distinctly resolved elements, such intensity variations are subresolution variations.

Subresolution assist features 30 can alleviate some of the problems described above as being associated with the radiation-patterning tool 12 of FIG. 1. Specifically, subresolution assist features 30 can stabilize an intensity difference between non-blocked regions 24a and blocked region 22a relative to subtle variations in focus of radiation 18a. Further, subresolution assist features 30 can improve the overall shape of blocked region 22a in the intensity profile 20a relative to the shape of region 22 in intensity profile 20 of FIG. 1. Specifically, subresolution assist features 30 can flatten a bottom of region 22a, and sharpen the transition at corners of region 22a, such that region 22a has a width which better approximates a width of structure 16a than the width of FIG. 1 region 22 approximates a width of structure 16.

A problem associated with the formation of subresolution assist features is that as the dimension of semiconductor devices becomes smaller the desired dimension of subresolution assist features also becomes smaller. It is therefore becoming increasingly difficult to form satisfactory subresolution assist features as integrated circuit device dimensions decrease. It would accordingly be desirable to develop alternative methods of forming subresolution assist features.

SUMMARY OF THE INVENTION

In one aspect, the invention encompasses a method of patterning radiation. The radiation is simultaneously passed through a structure and at least one subresolution assist feature proximate the structure. The structure defines a pattern of radiation intensity. The at least one subresolution assist feature comprises a material that is transmissive of at least a portion of the radiation. The subresolution assist feature alters the pattern of radiation intensity defined by the structure relative to a pattern of radiation intensity that would be defined in the absence of the subresolution assist feature.

In another aspect, the invention encompasses another method of patterning radiation. The radiation is simultaneously passed through a first material structure and at least one second material subresolution assist feature proximate the first material structure. The second material is different than the first material. The subresolution assist feature alters a pattern of radiation intensity defined by the first material structure relative to a pattern that would be defined in the absence of the subresolution assist feature.

In other aspects, the invention encompasses methods of forming radiation-patterning tools, and the radiation-patterning tools themselves.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
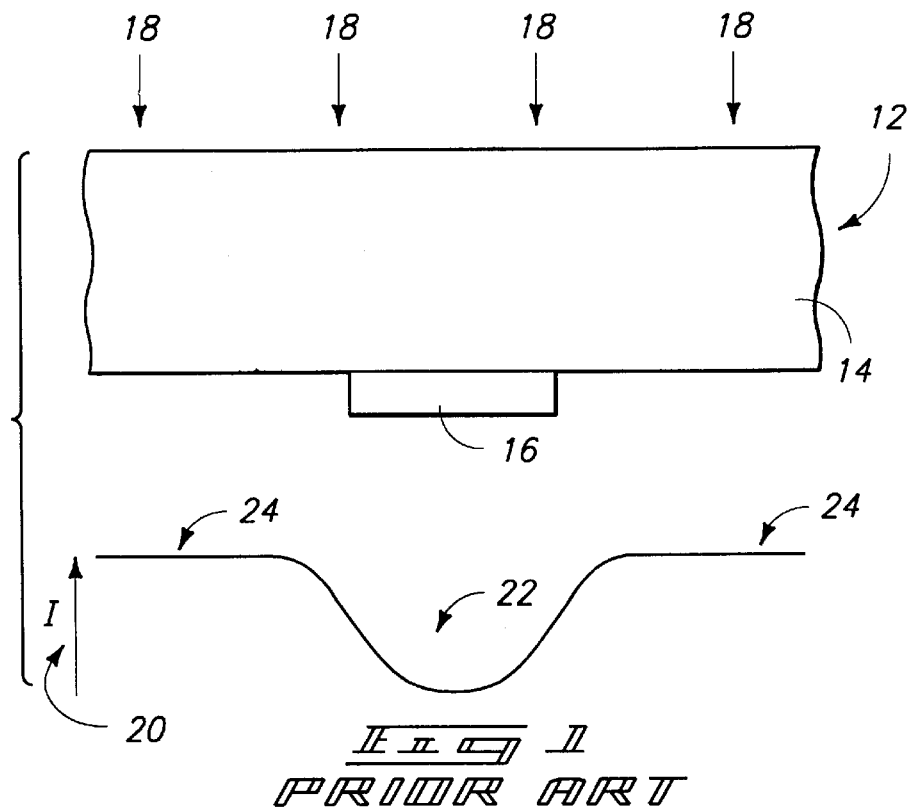
FIG. 1 is a diagrammatic view of a prior art radiation-patterning tool, and an intensity profile of radiation passing through the tool.
Figure 2:
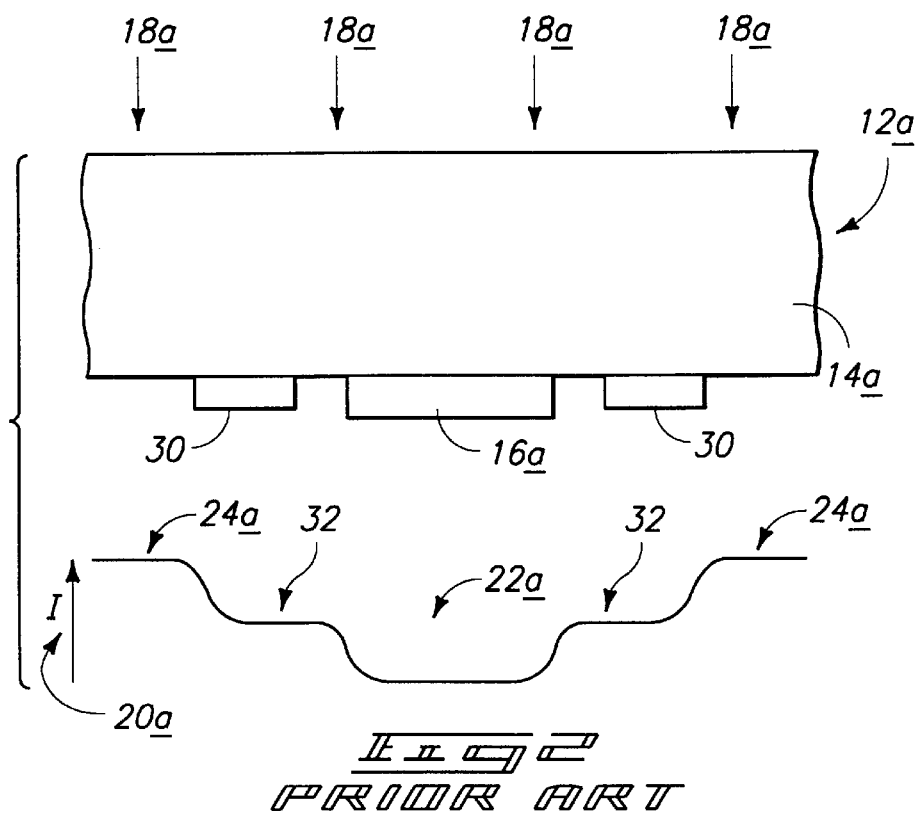
FIG. 2 is a diagrammatic view of another prior art radiation-patterning tool, and an intensity profile of radiation passing through the tool.
Figure 3:
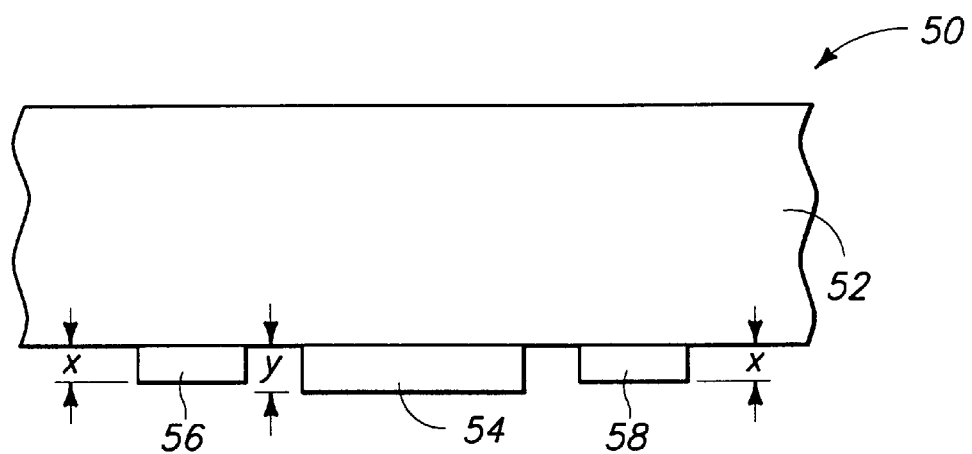
FIG. 3 is a diagrammatic view of a radiation-patterning tool encompassed by the present invention.

A radiation-patterning tool 50 encompassed by the present invention is shown in FIG. 3. Patterning tool 50 comprises a substrate 52 and a structure 54 joined with the substrate (structure 54 is on the substrate in the shown embodiment, but it is to be understood that the invention encompasses other embodiments (not shown), wherein structure 54 is spaced from the substrate by one or more intervening materials). Substrate 52 can comprise constructions identical to those of prior art substrate 14a of FIG. 2, and accordingly can comprise, for example, fused silica. Structure 54 can comprise constructions identical to structures 16a of FIG. 2, and accordingly can comprise, for example, chromium.

Radiation-patterning tool 50 comprises subresolution assist features 56 and 58 proximate structure 54. In the shown embodiment, two subresolution assist features are provided. It is to be understood, however, that only one subresolution assist feature could be provided, or that more than two subresolution assist features could be provided. In one aspect of the invention, subresolution assist features 56 and 58 preferably comprise a different material than structure 54. Accordingly, structure 54 comprises a first material, and subresolution assist features 56 and 58 comprise a second material. The material utilized in subresolution assist features 56 and 58 is preferably transmissive for at least some of the radiation patterned by radiation-patterning tool 50.

Similarly to the prior art construction described with reference to FIG. 2, substrate 52 comprises a material which is transmissive to a wavelength of radiation which is to be patterned, and structure 54 comprises a material which is less transmissive to the wavelength of radiation than is substrate 52. Accordingly, structure 54 defines a pattern of radiation intensity for the wavelength of radiation after the radiation is passed through patterning tool 50. In an aspect of the invention, subresolution assist features 56 and 58 can be formed of a material which is less transmissive of the wavelength of radiation than substrate 52, but more transmissive of the wavelength of radiation than the material of structure 54. Accordingly, subresolution assist features 56 and 58 are partially transmissive to the wavelength of radiation. It is found that such partial transmission of a wavelength of radiation can enable subresolution assist features of a given size to perform comparably to opaque subresolution assist features of a smaller size. Accordingly, whereas the prior art radiation-patterning tool 12a of FIG. 2 utilized subresolution assist features (30) formed of the same material as an interposed structure (16a), and accordingly utilized subresolution assist features having the same level of opaqueness to an incoming radiation (18a), such subresolution assist features would ideally be formed to a given maximal dimension for a particular wavelength of radiation, and a particular size of structure 54. In contrast, since subresolution assist features 56 and 58 of radiation-patterning tool 50 are more transmissive of radiation than structure 54, subresolution assist features 56 and 58 can be formed to a larger maximal dimension than could prior art subresolution assist features 30. This can simplify formation of resolution assist features 56 and 58 relative to the formation of prior art subresolution assist features 30.

It is emphasized that subresolution assist features 56 and 58 can be formed of materials which are at least partially transmissive to radiation passed through patterning tool 50 and utilized to pattern photoresist. This is in contrast to the prior art resolution assist features that were formed of materials opaque to radiation passed through a patterning tool. Of course, it is preferred that subresolution assist features 56 and 58 be only partially transmissive to radiation passed through patterning tool 50, rather than completely transmissive, as subresolution assist features 56 and 58 will preferably modify a pattern of radiation intensity defined by structure 54 relative to a pattern of radiation intensity that would be defined in the absence of the subresolution assist features. A preferred transmissivity of the material utilized in subresolution assist features 56 and 58 is from about 5% to about 20% of the radiation passed through tool 50 that has a suitable wavelength to pattern photoresist. For instance, if the radiation passed through tool 50 having a suitable wavelength to pattern photoresist is ultraviolet light radiation, subresolution assist features 56 and 58 will preferably transmit from about 5% to about 20% of said light.

Preferred materials for subresolution assist features 56 and 58 are materials comprising molybdenum and silicon (such as, for example, $MoSi_xN_yO_z$, wherein x, y and z are greater than zero), and materials comprising or consisting essentially of silicon carbide. It is noted that since subresolution assist features 56 and 58 are preferably at least partially transmissive of radiation passed through tool 50, the subresolution assist features preferably do not comprise chromium in applications in which ultraviolet light is to be passed through tool 50 and utilized for patterning photoresist.

In the shown embodiment, features 56 and 58 have a thickness "x" and structure 54 has a thickness "y" which is different than "x". It is noted that prior art constructions have subresolution features with thicknesses identical to the thickness of an interposed structure, as the subresolution features and interposed structure are formed from the same materials. In contrast, constructions of the present invention can have subresolution assist features with different thicknesses than an interposed structure. Further, although subresolution assist features 56 and 58 are shown having the same thickness ("x"), it is to be understood that subresolution assist features 56 and 58 can have thicknesses different from one another, and can comprise materials different from one another.

Figure 4:
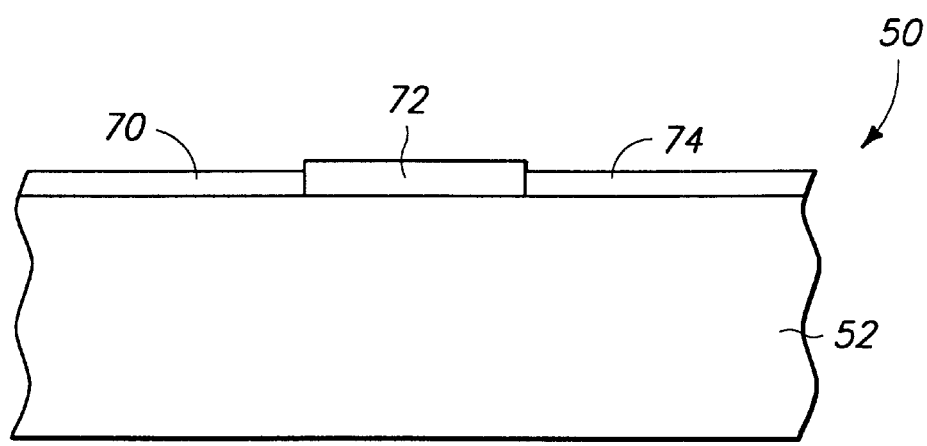
FIG. 4 is a diagrammatic view of a construction shown at a preliminary step of a method of forming a radiation-patterning tool in accordance with the present invention.
Figure 5:
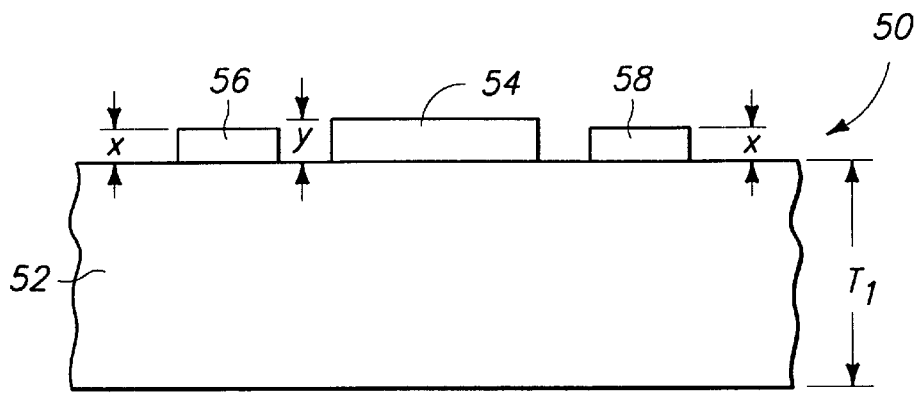
FIG. 5 is a view of the FIG. 4 construction shown at a processing step subsequent to that of FIG. 4.
Figure 6:
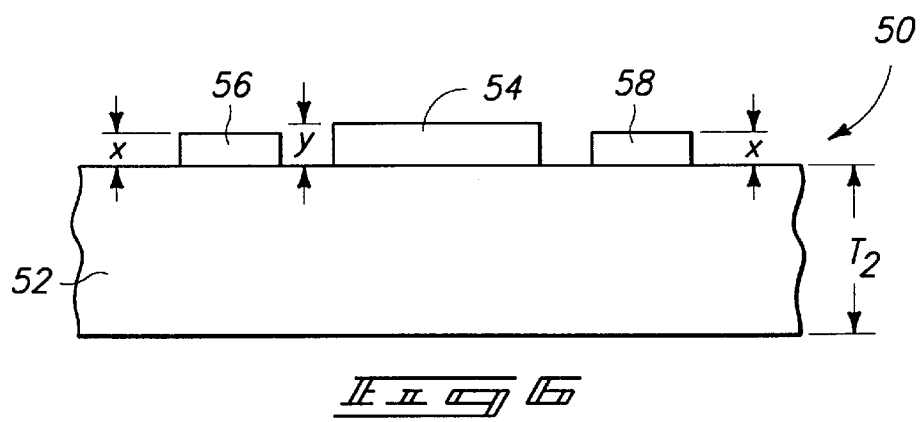
FIG. 6 is a view of the FIG. 4 construction shown at a processing step subsequent to that of FIG. 5.

FIGS. 4–6 describe a method of forming tool 50. Referring initially to FIG. 4, tool 50 is shown at a preliminary step of the method. Tool 50 comprises substrate 52, and materials 70, 72 and 74 over substrate 52. Material 72 will ultimately be patterned to form structure 54, and materials 70 and 74 will ultimately be patterned to form subresolution assist features 56 and 58. Accordingly, materials 70 and 74 are preferably different from material 72, and can be different than one another.

Referring to FIG. 5, materials 70, 72 and 74 (FIG. 4) are patterned to form subresolution assist feature 56, structure 54, and subresolution assist feature 58, respectively. Such patterning can be accomplished by, for example, conventional reticle patterning (such as, for example, formation of photoresist over materials 70, 72 and 74, followed by electron beam or laser etching to pattern the photoresist, and then etching of materials 70, 72 and 74 with subsequent removal of the photoresist). Although in the shown embodiment materials 70, 72 and 74 are patterned together (i.e., with a common electron beam or laser etch), it is to be understood that the invention encompasses other embodiments (not shown) wherein the materials are provided and patterned sequentially relative to one another. Common patterning of the materials can, however, be preferred, as such will utilize only one electron beam or laser etch, whereas sequential patterning can utilize multiple electron beam or laser etches. Also, it is noted that in the shown embodiment materials 70, 72 and 74 are formed to different thicknesses over substrate 52. It is to be understood that the invention encompasses other embodiments wherein materials 70, 72 and 74 are formed to a common thickness over substrate 52. Such other embodiments can comprise, for example, chemical-mechanical polishing of materials 70, 72 and 74 to form a planarized upper surface of such materials.

FIG. 5 shows substrate 52 having a thickness $T_1$. Such thickness can influence the effectiveness with which patterning tool 50 patterns radiation. Specifically, a ratio of the substrate thickness ($T_1$) relative to a subresolution assist feature thickness (x) defines a change in phase of radiation passing through both substrate 52 and the subresolution assist feature. Preferably, such change in phase is an integer multiple of 360° relative to a change in phase that occurs in radiation passing through both substrate 52 and structure 54. Such preferable condition can be accomplished by one or both of adjusting a thickness of a subresolution assist feature and adjusting a thickness of substrate 52. FIG. 6 illustrates tool 50 after the thickness of substrate 52 has been reduced to a thickness $T_2$. Although substantially an entirety of the substrate 14 is shown reduced in thickness in FIG. 6 (actually, an entirety of the shown substrate fragment is reduced in thickness), it is to be understood that the invention encompasses other embodiments (not shown) wherein the portions of the substrate underlying features 56 and 58 are treated selectively relative other portions of the substrate. For instance a thickness of portions of the substrate underlying features 56 and 58 can be reduced relative to a thickness of the portion of the substrate underlying structure 54. Alternatively, a thickness of the portion of the substrate underlying structure 54 can be reduced relative to a thickness of the portions of the substrate underlying features 56 and 58.

Figure 7:
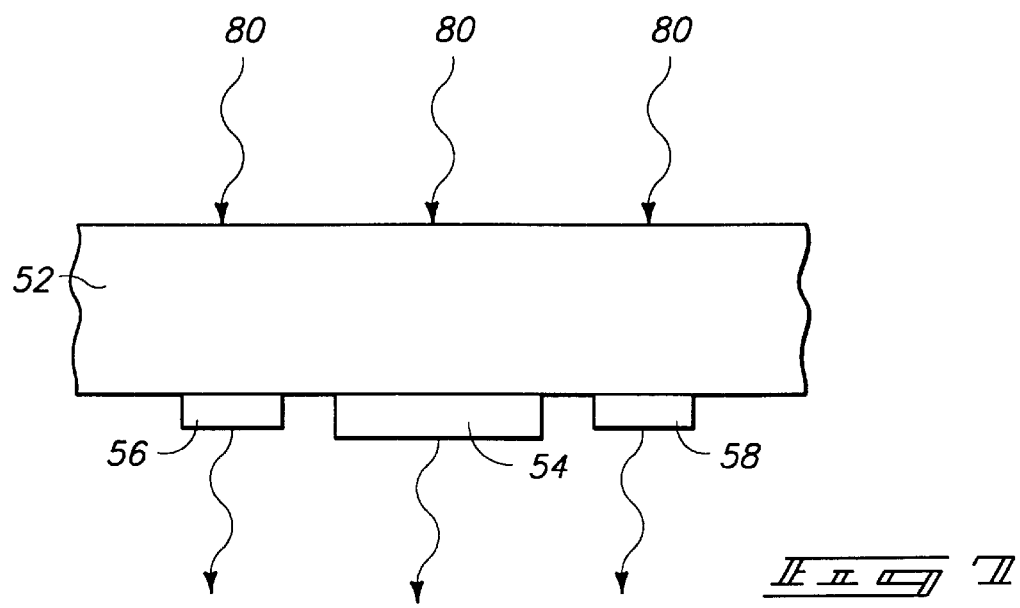
FIG. 7 is a view of the FIG. 6 construction shown with radiation passing through the construction in accordance with a preferred aspect of the present invention.

FIG. 7 illustrates a preferred configuration wherein radiation 80 enters substrate 52 in phase and exits subresolution features 56 and 58, and structure 54, in phase.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of patterning radiation comprising:
    forming a structure and at least one subresolution assist feature over a substrate, the substrate having a first thickness and the subresolution assist feature having a second thickness; the ratio of the first thickness to the second thickness defining a change in phase of radiation passing through the substrate and subresolution assist feature relative to radiation passing through the substrate and structure; said change in phase being about an integer multiple of 360°; and
    simultaneously passing the radiation through the structure and the at least one subresolution assist feature proximate the structure; the structure defining a pattern of radiation intensity; the at least one subresolution assist feature comprising a material that is partially transmissive of the radiation and altering the pattern of radiation intensity relative to a pattern of radiation intensity that would be defined by the structure in the absence of the subresolution assist feature.

2. The method of claim 1 wherein the radiation comprises light having a suitable wavelength to pattern photoresist, and wherein the subresolution assist feature is transmissive of from about 5% to about 20% of said light.

3. The method of claim 1 wherein the substrate comprises fused silica and the subresolution assist feature comprises molybdenum and silicon.

4. The method of claim 1 wherein the substrate comprises fused silica, the structure comprises chromium, and the subresolution assist feature comprises molybdenum and silicon.

5. The method of claim 1 wherein the substrate comprises fused silica and the subresolution assist feature comprises silicon carbide.

6. The method of claim 1 wherein the substrate comprises fused silica, the structure comprises chromium, and the subresolution assist feature comprises silicon carbide.

7. The method of claim 1 wherein the subresolution assist feature comprises molybdenum and silicon.

8. The method of claim 1 wherein the subresolution assist feature comprises silicon carbide.

9. A method of patterning radiation comprising:

forming a first material structure and at least one second material subresolution assist feature aver a substrate, the substrate having a first thickness and the subresolution assist feature having a second thickness; the ratio of the first thickness to the second thickness defining a change in phase of radiation passing through the substrate and subresolution assist feature relative to radiation passing through the substrate and first material structure; said change in phase being about an integer multiple of 360°; and simultaneously passing the radiation through the first material structure and the at least one second material subresolution assist feature proximate the first material structure; the first material structure defining a pattern of radiation intensity; the second material being different than the first material and altering the pattern of radiation intensity relative to a pattern of radiation intensity that would be defined by the first material structure in the absence of the subresolution assist feature.

10. The method of claim 9 wherein the radiation comprises light having a suitable wavelength to pattern photoresist, and wherein the subresolution assist feature is transmissive of from about 5% to about 20% of said light.

11. The method of claim 9 wherein the substrate comprises fused silica, the first material structure comprises chromium and the second material subresolution assist feature comprises molybdenum and silicon.

12. The method of claim 9 wherein the substrate comprises fused silica and the second material subresolution assist feature comprises molybdenum and silicon.

13. The method of claim 9 wherein the substrate comprises fused silica, the first material structure comprises chromium, and the second material subresolution assist feature comprises silicon carbide.

14. The method of claim 9 wherein the substrate comprises fused silica and the second material subresolution assist feature comprises silicon carbide.

15. The method of claim 9 wherein the second material comprises molybdenum and silicon.

16. The method of claim 9 wherein the second material comprises silicon carbide.

17. The method of claim 9 wherein the first material comprises chromium.

18. The method of claim 9 wherein the first material comprises chromium and the second material does not comprise chromium.

19. The method of claim 9 wherein the first material comprises chromium and the second material comprises molybdenum and silicon.

20. The method of claim 9 wherein the first material comprises chromium and the second material comprises silicon carbide.

* * * * *

UNITED STATES PATENT AND TRADEMARK OFFICE
CERTIFICATE OF CORRECTION

PATENT NO.    : 6,569,574 B2
DATED         : May 27, 2003
INVENTOR(S)   : Bill Baggenstoss It is certified that error appears in the above-identified patent and that said Letters Patent is hereby corrected as shown below:

Column 7,
Line 22, replace "aver" with -- over --.

Signed and Sealed this

Second Day of September, 2003

JAMES E. ROGAN
*Director of the United States Patent and Trademark Office*